(12) United States Patent
Shih et al.

(10) Patent No.: US 12,278,641 B2
(45) Date of Patent: Apr. 15, 2025

(54) PHASE-LOCK LOOP CIRCUIT, VOLTAGE-CONTROLLED OSCILLATOR AND COMPENSATION METHOD

(71) Applicant: NUVOTON TECHNOLOGY CORPORATION, Hsinchu (TW)

(72) Inventors: Cheng-Feng Shih, Hsinchu (TW); Jui-Hsien Fang, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 47 days.

(21) Appl. No.: 18/189,769

(22) Filed: Mar. 24, 2023

(65) Prior Publication Data

US 2024/0007114 A1    Jan. 4, 2024

(30) Foreign Application Priority Data

Jul. 4, 2022 (TW) .................................. 111124886

(51) Int. Cl.
*H03K 3/03* (2006.01)
*H03K 5/01* (2006.01)
*H03L 7/099* (2006.01)
*H03K 5/00* (2006.01)

(52) U.S. Cl.
CPC ............ *H03L 7/099* (2013.01); *H03K 3/0322* (2013.01); *H03K 5/01* (2013.01); *H03L 7/0995* (2013.01); *H03K 2005/00078* (2013.01)

(58) Field of Classification Search
CPC ...... H03K 3/0315; H03K 3/0322; H03K 5/01; H03K 2005/00078; H03L 7/099; H03L 7/0995
See application file for complete search history.

(56) References Cited

U.S. PATENT DOCUMENTS

| | | | | | |
|---|---|---|---|---|---|
| 5,061,907 | A | * | 10/1991 | Rasmussen | ........... H03L 7/0995 331/108 B |
| 5,559,476 | A | * | 9/1996 | Zhang | ................. H03K 3/0231 327/280 |
| 5,905,412 | A | * | 5/1999 | Rasmussen | ........... H03K 3/011 331/34 |

(Continued)

*Primary Examiner* — Levi Gannon
(74) *Attorney, Agent, or Firm* — MUNCY, GEISSLER, OLDS & LOWE, P.C.

(57) ABSTRACT

The present disclosure provides a voltage-controlled oscillator for a phase-lock loop circuit. The voltage-controlled oscillator is used to receive a control voltage and generate a clock signal, and includes a voltage-to-current device, a process compensation device, a subtraction unit and a clock signal generating module. The voltage-to-current device is used to generate a linear current according to the control voltage. The process compensation device is used to generate a compensation current according to the control voltage. The compensation current is proportional to a transistor operation speed corresponding to a process offset. The subtraction unit is electrically connected to the voltage-to-current device and the process compensation device, and is used to subtract the compensation current from the linear current to generate the control current. The clock signal generating module is electrically connected to the subtraction unit, and is used to generate the clock signal according to the control current.

3 Claims, 7 Drawing Sheets

(56) References Cited

U.S. PATENT DOCUMENTS

| | | | | |
|---|---|---|---|---|
| 11,705,895 B1* | 7/2023 | Cheng | ............... | H03L 7/0995 331/57 |
| 2005/0206466 A1* | 9/2005 | Sohn | ............. | G11C 11/406 331/185 |
| 2009/0072914 A1* | 3/2009 | Murata | ........... | H03K 5/1534 327/109 |
| 2014/0104005 A1* | 4/2014 | Zhang | ............. | G05F 3/02 331/17 |
| 2021/0091784 A1* | 3/2021 | Tseng | ............. | H03L 7/099 |

\* cited by examiner

PHASE-LOCK LOOP CIRCUIT, VOLTAGE-CONTROLLED OSCILLATOR AND COMPENSATION METHOD

CROSS-REFERENCE TO RELATED APPLICATION

This application claims the priority from TW Patent Application No. 111124886, filed on Jul. 4, 2022, and all contents of such TW Patent Applications are included in the present disclosure.

BACKGROUND

1. Field of the Invention

The present disclosure relates to a phase-lock loop circuit, in particular to, a phase-lock loop circuit, a voltage-controlled oscillator and a compensation method with a compensation effect, so as to compensate for performance problems caused by offsets (such as process offset) to avoid technical problems of over-design.

2. Description of the Related Art

Because of the wider application of the Internet of Thing and the requirements for more power saving and higher speed, the requirement of an integrated circuit (IC) for a clock signal is to save more and more power. A phase-lock loop (PLL) circuit is usually utilized as a clock signal source in the integrated circuit. After the phase-lock loop circuit divides an input clock signal (usually a reference clock signal) and a feedback clock signal respectively, the phase frequency of the divided input clock signal is compared with that of the divided feedback clock signal to adjust the clock signal to be outputted to the integrated circuit. Thus, the clock signal outputted to the integrated circuit is synchronized with the reference clock signal.

Further, refer to FIG. 1, FIG. 1 is a block diagram of a phase-lock loop circuit of the prior art. A phase-lock loop circuit 1 includes an input-end divider 101, a phase frequency detector 102, a charge pump circuit 103, a loop filter 104, a voltage-controlled oscillator 105, an output-end divider 106 and a feedback divider 107. The input-end divider 101 is configured to receive a clock signal I_CLK (usually a precise reference clock signal), and divide a frequency of the clock signal I_CLK by a multiple of N to generate a clock signal R_CLK. The feedback divider 107 is configured to receive a clock signal V_CLK, and divide a frequency of the clock signal V_CLK by a multiple of M to generate a feedback clock signal F_CLK. The phase frequency detector 102 is configured to generate pulse wave signals U_PL and D_PL based on a phase frequency difference between the clock signal R_CLK and the feedback clock signal F_CLK. The charge pump circuit 103 is configured to generate a charge-discharge current signal ICP based on the pulse wave signals U_PL and D_PL. The loop filter 104 is configured to charge/discharge a capacitor based on the charge-discharge current signal ICP to generate a control voltage VCP. The voltage-controlled oscillator 105 is configured to generate the clock signal V_CLK based on the control voltage VCP. The output-end divider 106 is configured to divide the frequency of the clock signal V_CLK by a multiple of R to generate an output clock signal O_CLK which is used for a back-end integrated circuit.

A frequency of the output clock signal O_CLK can be expressed as $fo=fi(M*R/N)$ wherein fo is the frequency of the output clock signal O_CLK, and fi is the frequency of the clock signal I_CLK. Usually, the performance of electronic circuits offsets due to factors such as applied voltage, temperature or process. Therefore, the frequency fo of the output clock signal O_CLK is affected by the offset. For example, a process offset often includes a fast PMOS-fast NMOS offset (FF corner), a typical PMOS-typical NMOS offset (TT corner) and a slow PMOS-slow NMOS offset (SS corner). These three different process offsets also result in different operating frequency ranges of the output clock signal O_CLK.

When the process offset is the typical PMOS-typical NMOS offset, the frequency fo of the output clock signal O_CLK is designed to be between 70 MHz and 620 MHz. When the process offset is the fast PMOS-fast NMOS offset and slow PMOS-slow NMOS offset, the frequency fo of the output clock signal O_CLK may be between 85 MHz and 720 MHz and between 55 MHz and 530 MHz, respectively. In order to ensure that the frequency fo of the output clock signal O_CLK for both the fast PMOS-fast NMOS offset and slow PMOS-slow NMOS offset can operate between 70 MHz and 620 MHz, an operating frequency range of the frequency fo of the output clock signal O_CLK for the fast PMOS-fast NMOS offset and slow PMOS-slow NMOS offset must be designed to be larger than the range of 70 MHz and 620 MHz. That is, for each of the two operating frequency ranges, it must be designed so that a minimum value of each operating frequency range is less than 70 MHz and an maximum value of that is greater than 620 MHz. In other words, the operating frequency range of the frequency fo of the output clock signal O_CLK for the fast PMOS-fast NMOS offset and the slow PMOS-slow NMOS offset must be over-designed. Over-design will result in increasing circuit area and increase current consumption, which is contrary to the current trend of circuits requirements as smaller area and less power consumption.

SUMMARY

An embodiment of the present disclosure provides a voltage-controlled oscillator for a phase-lock loop circuit. The voltage-controlled oscillator is configured to receive a control voltage and generate a clock signal, and the voltage-controlled oscillator includes a voltage-to-current device, a process compensation device, a subtraction unit and a clock signal generating module. The voltage-to-current device is configured to generate a linear current based on the control voltage. The process compensation device is configured to generate a compensation current based on the control voltage. Besides, the compensation current is proportional to a transistor operation speed corresponding to a process offset. The subtraction unit is electrically connected to the voltage-to-current device and the process compensation device, and the subtraction unit is configured to subtract the compensation current from the linear current to generate a control current. The clock signal generating module is electrically connected to the subtract unit, and the clock signal generating module is configured to generate the clock signal based on the control current.

An embodiment of the present disclosure also provides a phase-lock loop circuit. The phase-lock loop circuit includes an input-end divider, a phase frequency detector, a charge pump circuit, a loop filter, a voltage-controlled oscillator, an output-end divider and a feedback divider. The input-end divider is configured to divide a frequency of a first clock signal to generate a second clock signal. The phase frequency detector is electrically connected to the input-end divider, and the phase frequency detector is configured to generate a first pulse wave signal and a second pulse wave signal based on a phase frequency difference between the second clock signal and a feedback clock signal. The charge pump circuit is electrically connected to the phase frequency detector, and the charge pump circuit is configured to generate a charge-discharge current signal based on the first pulse wave signal and the second pulse wave signal. The loop filter is electrically connected to the charge pump circuit, and the loop filter is configured to generate a control voltage based on the charge-discharge current signal. The voltage-controlled oscillator is electrically connected to the loop filter, and the voltage-controlled oscillator is configured to generate a linear current based on the control voltage, generate a compensation current based on a process offset, generate a control current by subtracting the compensation current from the linear current, and generate a third clock signal based on the control current wherein the compensation current is proportional to a transistor operation speed corresponding to the process offset. The output-end divider is electrically connected to the voltage-controlled oscillator, and the output-end divider is configured to divide a frequency of the third clock signal to generate an output clock signal. The feedback divider is electrically connected to the voltage-controlled oscillator and the phase frequency detector, and the feedback divider is configured to divide the frequency of the third clock signal to generate a feedback clock signal.

An embodiment of the present disclosure provides a voltage-controlled oscillator for a phase-lock loop circuit. The voltage-controlled oscillator is configured to receive a control voltage and generate a clock signal, and the voltage-controlled oscillator includes a voltage-to-current device, a compensation device and a clock signal generating module. The voltage-to-current device is configured to generate a linear current based on the control voltage. The compensation device is electrically connected to the voltage-to-current device, and the compensation device is configured to generate a control current based on a slope compensation control signal. In addition, the control current and the linear current are in a multiple relationship, and a multiple is determined by the slope compensation control signal. When a frequency/voltage slope between a frequency of the clock signal and the control voltage is within a range, the slope compensation control signal keeps the multiple the same. When the frequency/voltage slope is greater than a maximum slope value of the range, the slope compensation control signal decreases the multiple. When the frequency/voltage slope is less than a minimum slope value of the range, the slope compensation control signal increases the multiple. The clock signal generating module is electrically connected to the compensation device, and the clock signal generating module is configured to generate the clock signal based on the control current.

An embodiment of the present disclosure provides a phase-lock loop circuit. The phase-lock loop circuit includes an input-end divider, a phase frequency detector, a charge pump circuit, a loop filter, a voltage-controlled oscillator, an output-end divider, a feedback divider and a frequency/voltage slope calculation module. The input-end divider is configured to divide a frequency of a first clock signal to generate a second clock signal. The phase frequency detector is electrically connected to the input-end divider, and the phase frequency detector is configured to generate a first pulse wave signal and a second pulse wave signal based on a phase frequency difference between a second clock signal and a feedback clock signal. The charge pump circuit is electrically connected to the phase frequency detector, and the charge pump circuit is configured to generate a charge-discharge current signal based on the first pulse wave signal and the second pulse wave signal. The loop filter is electrically connected to the charge pump circuit, and the loop filter is configured to generate a control voltage based on the charge-discharge current signal. The voltage-controlled oscillator is electrically connected to the loop filter, and the voltage-controlled oscillator is configured to generate a linear current based on the control voltage, generate a control current based on a slope compensation control signal, and generate a third clock signal based on the control current. Moreover, the control current and the linear current are in a multiple relationship, and a multiple of the multiple relationship is determined by the slope compensation control signal. When a frequency/voltage slope between a frequency of the third clock signal and the control voltage is within a range, the slope compensation control signal keeps the multiple the same. When the frequency/voltage slope is greater than a maximum slope value of the range, the slope compensation control signal decreases the multiple. When the frequency/voltage slope is less than a minimum slope value of the range, the slope compensation control signal increases the multiple. The output-end divider is electrically connected to the voltage-controlled oscillator, and the output-end divider is configured to divide the frequency of the third clock signal to generate an output clock signal. The feedback divider is electrically connected to the voltage-controlled oscillator and the phase frequency detector, and the feedback divider is configured to divide the frequency of the third clock signal to generate a feedback clock signal. The frequency/voltage slope calculation module is electrically connected to the loop filter and the voltage-controlled oscillator. The frequency/voltage slope calculation module is configured to calculate the frequency/voltage slope based on the control voltage, the third clock signal and the first clock signal, and configured to generate the slope compensation control signal based on the frequency/voltage slope.

An embodiment of the present disclosure provides a compensation method for a phase-lock loop circuit. The method includes the following steps. An analog-to-digital conversion is performed on an analog control voltage which is outputted by a loop filter in the phase-lock loop circuit to generate a control voltage code. A frequency of a second clock signal is obtained based on a first clock signal which is input to the phase-lock loop circuit and a second clock signal generated by a voltage-controlled oscillator in the phase-lock loop circuit. A frequency/voltage slope of the voltage-controlled oscillator is calculated based on the control voltage code and the frequency of the second clock signal. As well, whether to increase, decrease or maintain a frequency/voltage frequency of the voltage-controlled oscillator is determined based on the frequency/voltage slope.

To sum up, through the technical solutions of the present disclosure, the phase-lock loop circuit does not have to be over-designed, and the circuit area and the energy consumption can be effectively reduced.

To further understand the technology, means, and effects of the present disclosure, reference may be made by the detailed description and drawing as follows. Accordingly, the purposes, features and concepts of the present disclosure can be thoroughly and concretely understood. However, the following detail description and drawings are only used to reference and illustrate the implementation of the present disclosure, and they are not used to limit the present disclosure.

BRIEF DESCRIPTION OF THE DRAWINGS

The drawings are provided to make the persons with ordinary knowledge in the field of the art further understand the present disclosure, and are incorporated into and constitute a part of the specification of the present disclosure. The drawings illustrate demonstrated embodiments of the present disclosure, and are used to explain the principal of the present disclosure together with the description of the present disclosure.

DESCRIPTION OF THE PREFERRED EMBODIMENTS

Figure 1:
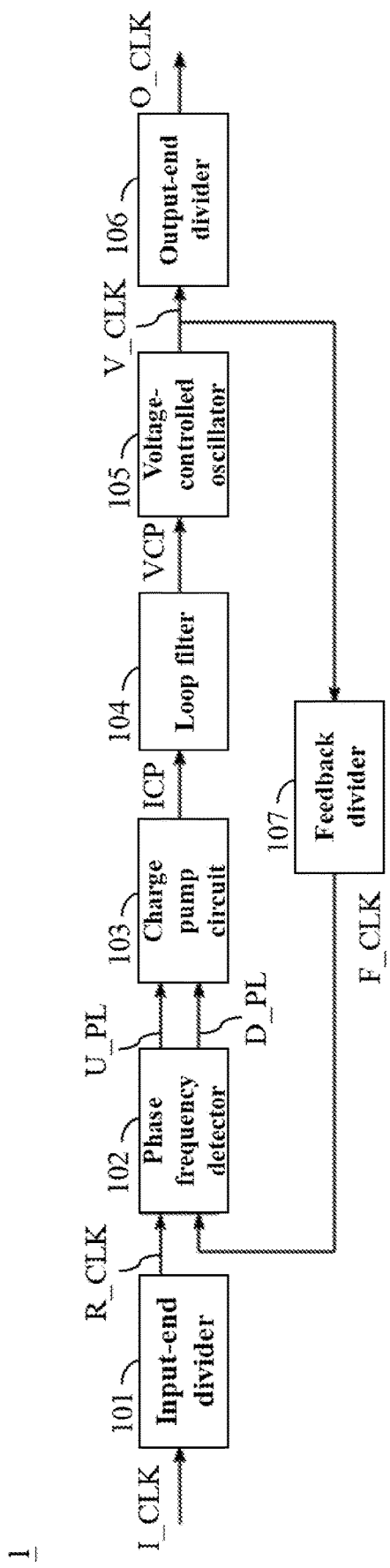
FIG. 1 is a block diagram of a phase-lock loop circuit according to a prior art.

The embodiments of the present disclosure are described in detail as reference, and the drawings of the present disclosure are illustrated. In the case of possibility, the element symbols are used in the drawings to refer to the same or similar components. In addition, the embodiment is only one approach of the implementation of the design concept of the present disclosure, and the following multiple embodiments are not intended to limit the present disclosure.

In order to solve the technical problems of increasing circuit area and power consumption caused by over-design problems, the present disclosure provides various embodiments of phase-lock loop circuit. Additionally, based on the phase-lock loop circuit, the present disclosure also provides a corresponding voltage-controlled oscillator and a compensation method for the phase-lock loop circuit. By using the phase-lock loop circuit of the present disclosure, an integrated circuit can obtain a precise output clock signal for operation. Furthermore, since there is no over-design, the circuit area and power consumption can be reduced. Therefore, it meets the demand trend of circuits with less energy consumption and small area.

In one embodiment, the voltage-controlled oscillator is utilized to compensate a process offset. An output clock signal is generated based on a control current, and the control current is generated by subtracting a compensation current from a linear current. Besides, the compensation current is proportional to a transistor operating speed corresponding to the process offset. When the transistor operating speed is faster, the control current is smaller. Conversely, the transistor operating speed is slower, then the control current is larger. In this way, there is no need to over-design an operating frequency range of the output clock signal for a fast PMOS-fast NMOS offset and a slow PMOS-slow NMOS offset. When the transistor operating speed is faster, a frequency of the output clock signal can still reach a minimum value of the operating frequency range of a typical PMOS-typical NMOS offset because the control current subtracts the larger compensation current. Similarly, when the transistor operating speed is slower, the frequency of the output clock signal can still reach a maximum value of the operating frequency range of the typical PMOS-typical NMOS offset because the control current subtracts the less compensation current.

In another embodiment, a frequency/voltage slope is controlled to compensate for possible offsets, such as, but not limited to, the offsets generated by an operating voltage, a process and/or a temperature. Moreover, in this embodiment, a digital control voltage code of the control voltage received by the voltage-controlled oscillator is obtained, and the frequency of the output clock signal output by the voltage-controlled oscillator is obtained to calculate the frequency/voltage slope of the voltage-controlled oscillator. When the frequency/voltage slope is within a range, the frequency/voltage slope of the voltage-controlled oscillator does not have to be adjusted. When the frequency/voltage slope is greater than an maximum slope value of the range, the frequency/voltage slope of the voltage-controlled oscillator is decreased. When the frequency/voltage slope is less than a minimum slope value of the range, the frequency/voltage slope of the voltage-controlled oscillator is increased. As a result, the offset can be compensated dynamically to solve the technical problem that the frequency of the output clock signal cannot reach the minimum value and the maximum value of the designed operating frequency range due to the offset. Likewise, this embodiment also solves the technical problem that needs to be over-designed.

Figure 2:
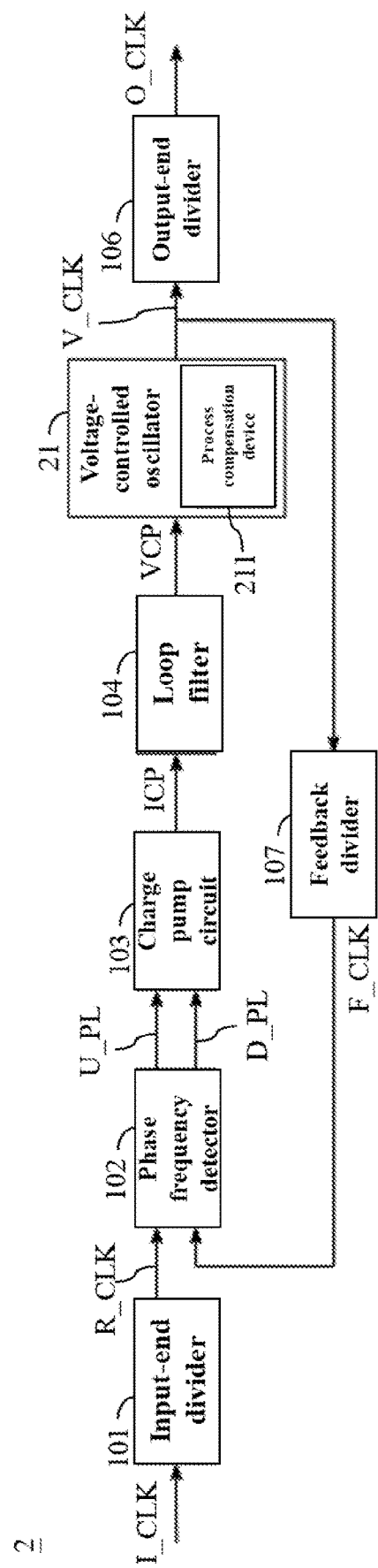
FIG. 2 is a block diagram of a phase-lock loop circuit according to an embodiment of the present disclosure.

Firstly, refer to FIG. 2, FIG. 2 is block diagram of a phase-lock loop circuit according to an embodiment of the present disclosure. In this embodiment, a phase-lock loop circuit 2 includes an input-end divider 101, a phase frequency detector 102, a charge pump circuit 103, a loop filter 104, a voltage-controlled oscillator 21, an output-end divider 106 and a feedback divider 107. The input-end divider 101 is electrically connected to the phase frequency detector 102. The charge pump circuit 103 is electrically connected to the phase frequency detector 102. The loop filter 104 is electrically connected to the charge pump 103. The output-end divider 106 is electrically connected to the voltage-controlled oscillator 21. Also, the feedback divider 107 is electrically connected to the voltage-controlled oscillator 21 and the phase frequency detector 102.

The input-end divider 101 is configured to receive a clock signal I_CLK, which is usually a precise reference clock signal, and divide a frequency of the clock signal I_CLK by a multiple of N to generate a clock signal R_CLK. The feedback divider 107 is configured to receive a clock signal V_CLK, and divide a frequency of the clock signal V_CLK by a multiple of M to generate a feedback clock signal F_CLK. The phase frequency detector 102 is configured to generate pulse wave signals U_PL and D_PL based on a phase frequency difference between the clock signal R_CLK and the feedback clock signal F_CLK. The charge pump circuit 103 is configured to generate a charge-discharge current signal ICP based on the pulse wave signals U_PL and D_PL. The loop filter 104 is configured to charge/discharge a capacitor (for example, the loop filter 104 is designed with the capacitor) based on the charge-discharge current signal ICP to generate a control voltage VCP. Besides, the loop filter 104 is configured to filter out noise to generate the control voltage VCP. The voltage-controlled oscillator 21 is configured to generate the clock signal V_CLK. The output-end divider 106 is configured to divide the frequency of the clock signal V_CLK by a multiple of R to generate an output clock signal O_CLK which is used by a back-end integrated circuit.

The voltage-controlled oscillator 21 includes a process compensation device 211. The process compensation device 211 is configured to compensate for a frequency drift caused by the process offset without over-designing an operating frequency range of the output clock signal O_CLK of the phase-lock loop circuit 2. Further, the voltage-controlled oscillator 21 is configured to generate a linear current based on the control voltage VCP. The process compensation device 211 is configured to generate a compensation current based on the process offset. The voltage-controlled oscillator 21 subtracts the compensation current from the linear current to generate a control current, and the voltage-controlled oscillator 21 generates the clock signal V_CLK based on the control current. In addition, the compensation current is proportional to the transistor operating speed corresponding to the process offset. For example, the compensation current corresponding to the typical PMOS-typical NMOS offset is smaller than that corresponding to the fast PMOS-fast NMOS offset. As well, the compensation current corresponding to the typical PMOS-typical NMOS offset is greater than that corresponding to the slow PMOS-slow NMOS offset.

Figure 3:
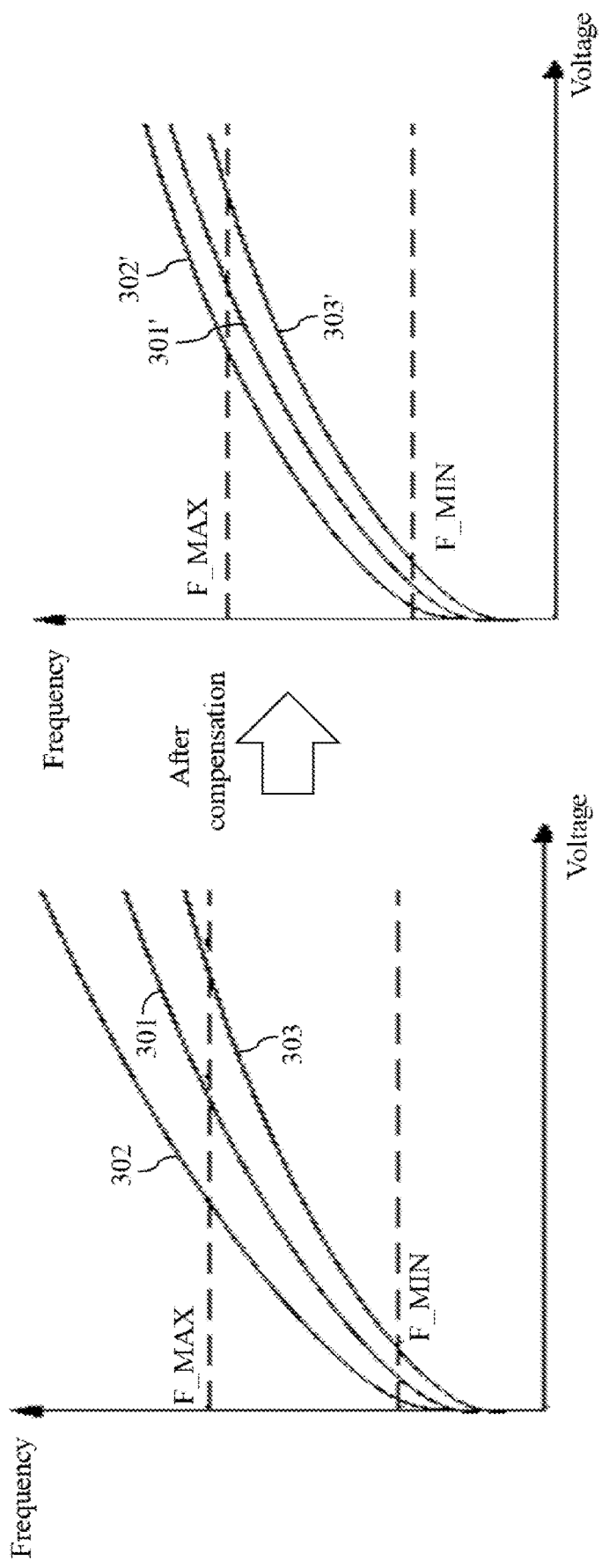
FIG. 3 is a curve graph of an operating frequency range for an output clock signal of a phase-lock loop circuit according to the prior art and an embodiment of the present disclosure.

Further, refer to FIG. 3, FIG. 3 is a curve graph of an operating frequency range for an output clock signal of a phase-lock loop circuit according to the prior art and an embodiment of the present disclosure. On the left of FIG. 3, after the operating frequency range of the output clock signal of the phase-lock loop circuit of the prior art is over-designed, a frequency/voltage curve 301 of the typical PMOS-typical NMOS offset, a frequency/voltage curve 302 of the fast PMOS-fast NMOS offset and a frequency/voltage curve 303 of the slow PMOS-slow NMOS offset can all meet the requirements of an maximum value F_MAX and a minimum value F_MIN of the designed operating frequency range. However, as mentioned above, over-design has technical problems of increased energy consumption and circuit area. On the right of FIG. 3, after the process compensation device 211 is configured in the present disclosure, a frequency/voltage curve 301' of the typical PMOS-typical NMOS offset, a frequency/voltage curve 302' of the fast PMOS-fast NMOS offset and a frequency/voltage curve 303' of the slow PMOS-slow NMOS offset can all meet the requirements of the maximum value F_MAX and the minimum value F_MIN of the designed operating frequency range. As well, there is no technical problem that the energy consumption and the area are increased due to the over-design of the prior art.

Figure 4:
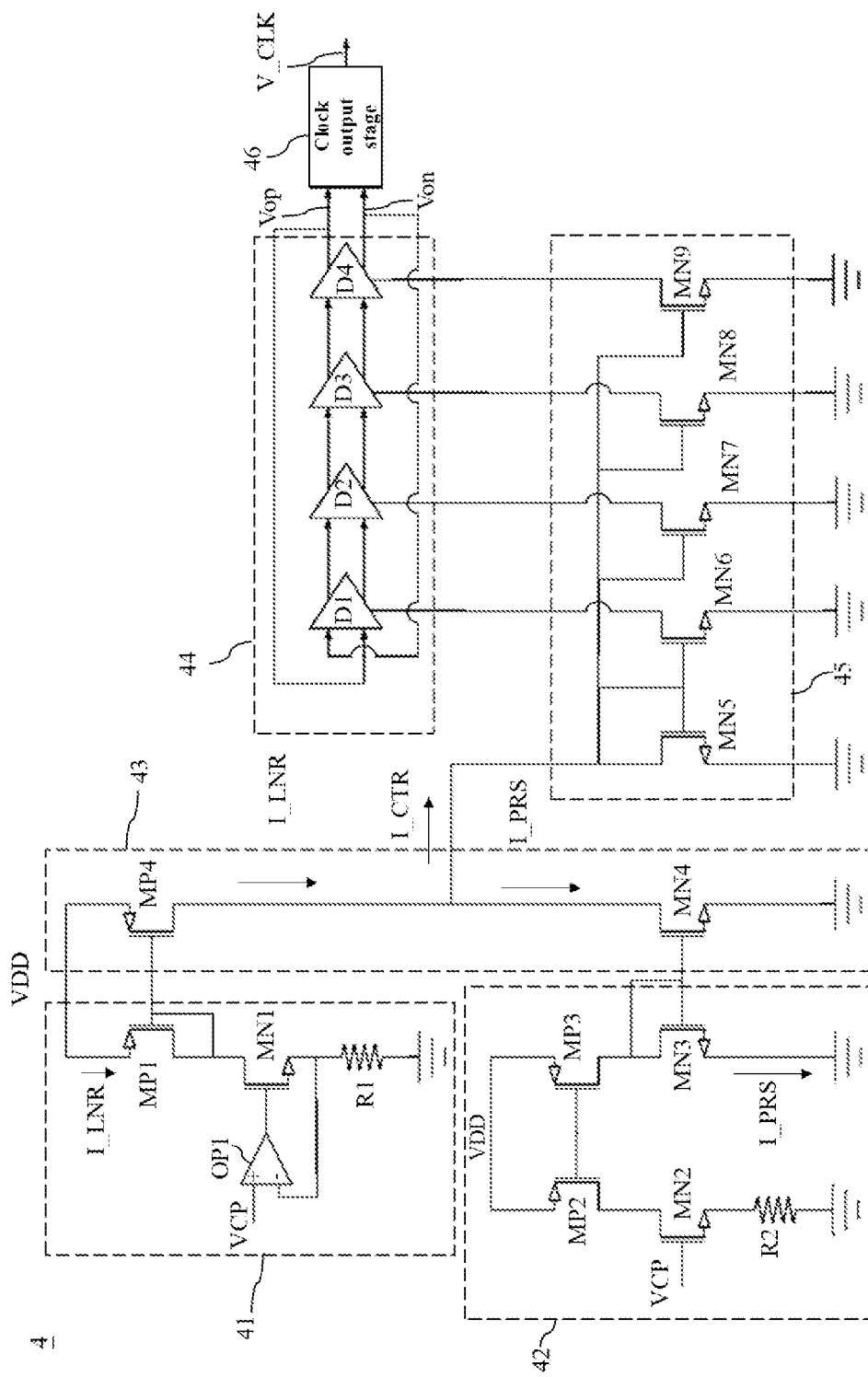
FIG. 4 is a circuit diagram of a voltage-controlled oscillator according to an embodiment of the present disclosure.

Refer to FIG. 4, FIG. 4 is a circuit diagram of a voltage-controlled oscillator according to an embodiment of the present disclosure. The voltage-controlled oscillator 21 can be implemented by a voltage-controlled oscillator 4 in FIG. 4, and the process compensation device 211 can be implemented by a process compensation device 42 in FIG. 4, but the present disclosure is not limited thereto. In this embodiment, the voltage-controlled oscillator 4 includes a voltage-to-current device 41, the process compensation device 42, a subtraction unit 43 and a clock signal generating module. The clock signal generating module includes a delay oscillation module 44, a current module 45 and a clock output stage 46. The subtraction unit 43 is electrically connected to the voltage-to-current device 41, the process compensation device 42 and the clock signal generating module.

The voltage-to-current device 41 is configured to generate a linear current I_LNR based on the control voltage VCP. The process compensation device 42 is configured to generate a compensation current I_PRS based on the control voltage VCP. Besides, the compensation current I_PRS is proportional to the transistor operating speed corresponding to the process offset. The subtraction unit 43 subtracts the compensation current I_PRS from the linear current I_LNR to generate a control current I_CTR. Then, the clock signal generating module generates the clock signal V_CLK based on the control current I_CTR.

The voltage-to-current device 41 includes a PMOS transistor MP1, an NMOS transistor MN1, a comparator OP1 and a resistor R1. A source of the PMOS transistor MP1 is electrically connected to a supply voltage VDD. A gate of the PMOS transistor MP1 is electrically connected to a drain of the PMOS transistor MP1, the subtraction unit 43 and a drain of the NMOS transistor MN1. A gate of the NMOS transistor MN1 is electrically connected to an output end of the comparator OP1. A source of the NMOS transistor MN1 is electrically connected to a negative input end of the comparator OP1 and one end of the resistor R1. A positive input end of the comparator OP1 is configured to receive the control voltage VCP. The other end of the resistor R1 is electrically connected to a low voltage (such as a ground voltage). Through the preceding structure, a current value of the linear current I_LNR generated is a value obtained by dividing the control voltage VCP by the resistor R1 (i.e., I_LNR=VCP/R1).

The process compensation device 42 includes PMOS transistors MP2, MP3, NMOS transistors MN2, MN3 and a resistor R2. A source of the PMOS transistor MP2 and a source of the PMOS transistor MP3 are electrically connected to the supply voltage VDD. A gate of the PMOS transistor MP2 is electrically connected to a gate of the PMOS transistor MP3. A drain of the PMOS transistor MP2 is electrically connected to a drain of the NMOS transistor MN2, and a drain of the PMOS transistor MP3 is electrically connected to a drain of the NMOS transistor MN3. A gate of the NMOS transistor MN2 is configured to receive the control voltage VCP. A source of the NMOS transistor MN2 is electrically connected to one end of the resistor R2, and the other end of the resistor R2 is electrically connected to the low voltage. A gate of the NMOS transistor MN2 is electrically connected to the subtraction unit 43 and a drain of the NMOS transistor MN3. A source of the NMOS transistor MN3 is electrically connected to the low voltage. Based on the mentioned structure, a current value of the compensation current I_PRS is a value obtained by dividing the difference between the control voltage VCP and the threshold voltage Vth of the NMOS transistor MN2 by the resistor R2 (i.e., I_PRS=(VCP−Vth)/R2).

The subtraction unit 43 is a current subtractor, and the subtraction unit 43 can be implemented through a PMOS transistor MP4 and an NMOS transistor MN4. A gate of the PMOS transistor MP4 is electrically connected to the gate of the PMOS transistor MP1. A source of the PMOS transistor MP4 is electrically connected to the supply voltage VDD. A drain of the PMOS transistor MP4 is electrically connected to a drain of the NMOS transistor MN4. A gate of the NMOS transistor MN4 is electrically connected to a gate of the NMOS transistor MN3. The source of the NMOS transistor MN4 is electrically connected to the low voltage. Based on the mentioned structure, the drain of the PMOS transistor MP4 and the drain of the NMOS transistor MN4 output the control current I_CTR, and the control voltage I_CTR is a current value obtained by subtracting the compensation current I_PRS from the linear current I_LNR. That is, I_CTR=I_LNR−I_PRS, (VCP/R1)−((VCP−Vth)/R2).

The threshold voltage Vth of the NMOS transistor MN2 may vary with the process offset. The threshold voltage Vth of the NMOS transistor MN2 corresponding to the slow PMOS-slow NMOS offset is greater than the threshold voltage Vth of the NMOS transistor MN2 corresponding to the typical PMOS-typical NMOS offset. As well, the threshold voltage Vth of the NMOS transistor MN2 corresponding to the fast PMOS-fast NMOS offset is lower than the threshold voltage Vth of the NMOS transistor MN2 corresponding to the typical PMOS-typical NMOS offset. In other words, the control current I_CTR corresponding to the fast PMOS-fast NMOS offset is smaller than the control current I_CTR corresponding to the typical PMOS-typical NMOS offset. Also, the control current I_CTR corresponding to the typical PMOS-typical NMOS offset is smaller than the control current I_CTR corresponding to the slow PMOS-slow NMOS offset. Therefore, in the case of the same control voltage VCP, compared with the typical PMOS-typical NMOS offset, the frequency of the clock signal V_CLK output by the voltage-controlled oscillator 4 is not faster than that for the fast PMOS-fast NMOS offset. Also, the frequency of the clock signal V_CLK output by the voltage-controlled oscillator 4 is not relatively slower than that for the slow PMOS-slow NMOS offset. In short, based on the mentioned structure, the process offset can be effectively compensated.

Further, the clock signal generating module includes a current module 45, a delay oscillation module 44 and a clock output stage 46. The current module 45 is electrically connected to the delay oscillation module 44 and the clock output stage 46. The current module 45 includes a plurality of current units, and the plurality of current units are electrically connected to the subtraction unit 43; for example, as shown in FIG. 4, NMOS transistors MN6 to MN9 and a shared NMOS transistor MN5 respectively form 4 current units. The plurality of current units are configured to generate a plurality of delay control currents based on the control current I_CTR. The delay oscillation module 44 includes a plurality of delay units D1 to D4 connected in series, and the serial delay units D1 to D4 form an oscillation feedback path. Delay times of the plurality of delay units D1 to D4 are controlled by the plurality of delay control currents. Also, the delay oscillation module 44 is configured to generate sine wave signals Vop and Von. The clock output stage 46 is configured to generate the clock signal V_CLK based on the sine wave signals Vop and Von.

The current module 45 includes the NMOS transistors MN5 to MN9. The NMOS transistors MN6 to MN9 and the shared NMOS transistor MN5 respectively form the 4 current units. Gates of the NMOS transistors MN6 to MN9 are electrically connected to a gate of the NMOS transistor MN5. A drain of the NMOS transistor MN5 is electrically connected to a drain of the NMOS transistor MN4 and the gate of the NMOS transistor MN5. Sources of the NMOS transistors MN5 to MN9 are electrically connected to the low voltage. Drains of the NMOS transistors MN6 to MN9 are electrically connected to bias ends of the delay units D1 to D4. In this way, the delay times of the delay units D1 to D4 are controlled respectively through the generated plurality of delay control currents.

The delay oscillation module 44 includes the plurality of delay units D1 to D4. Except for the last delay unit D4, a first output end of each of the other delay units D1 to D3 is electrically connected to a first input end of the next delay unit D2 to D4 respectively, and a second output end of each of the other delay units D1 to D3 is electrically connected to a second input end of the next delay unit D2 to D4 respectively. A first output end of the last delay unit D4 is electrically connected to a second input end of the first delay unit D1, and a second output end of the last delay unit D4 is electrically connected to a first input end of the first delay unit D1. The delay times of the plurality of delay units D1 to D4 are respectively controlled by the plurality of delay control currents. Also, the first output end of the last delay unit D4 is configured to generate the sine wave signal Vop, and the second output end of the delay unit D4 is configured to generate the sine wave signal Von. Please note here that the number of the delay units D1 to D4 is not intended to limit the present disclosure. In addition, when the number of the delay units D1 to D4 is changed, the number of the current units of the current module must also be changed accordingly.

Figure 5:
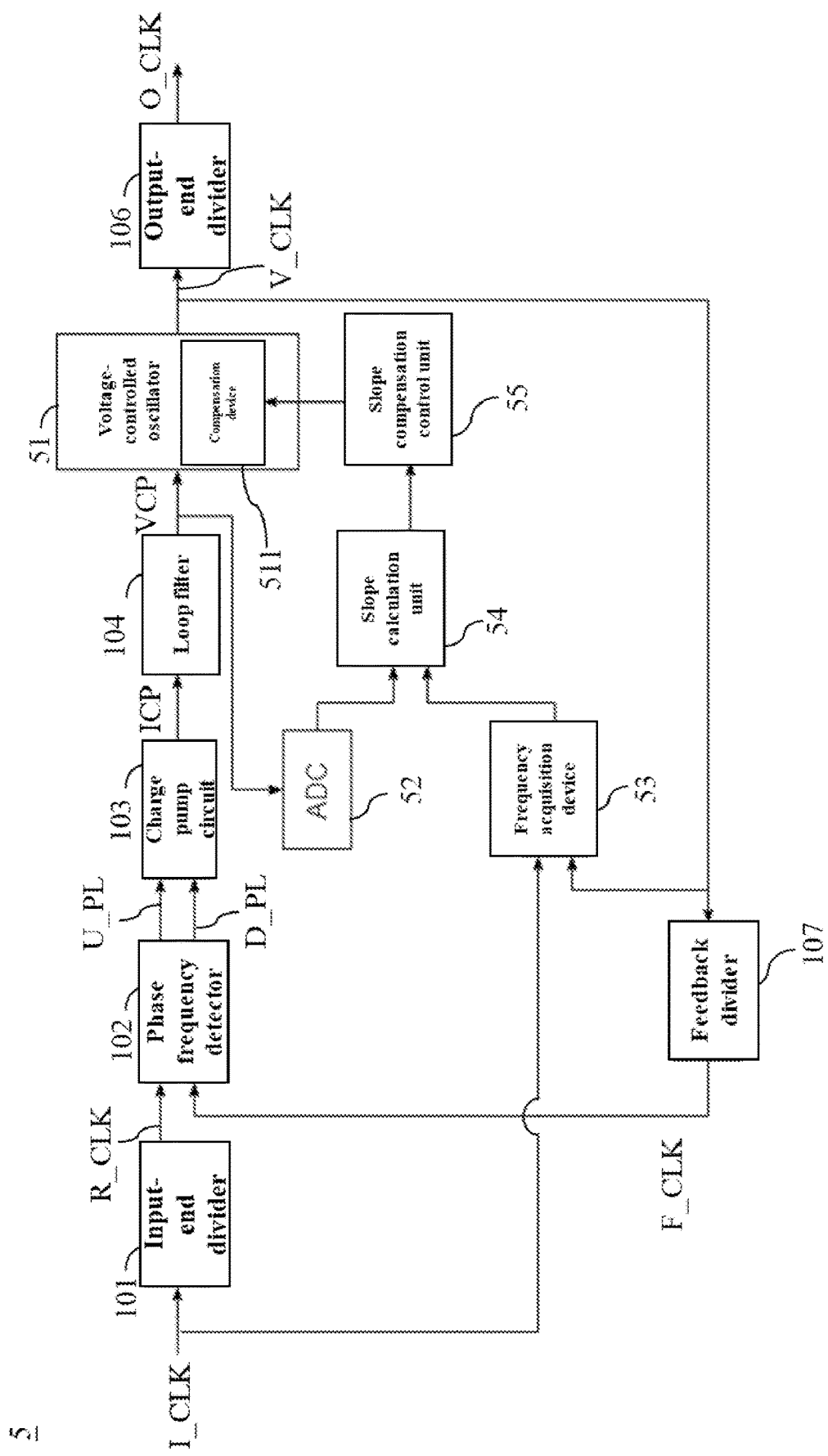
FIG. 5 is a block diagram of a phase-lock loop circuit according to another embodiment of the present disclosure.

Refer to FIG. 5, FIG. 5 is a block diagram of a phase-lock loop circuit according to another embodiment of the present disclosure. In this embodiment, a phase-lock loop circuit 5 includes the input-end divider 101, the phase frequency detector 102, the charge pump circuit 103, the loop filter 104, a voltage-controlled oscillator 51, the output-end divider 106, the feedback divider 107 and a frequency/voltage slope calculation module. Moreover, the frequency/voltage slope calculation module includes an analog-to-digital converter 52, a frequency acquisition device 53, a slope calculation unit 54 and a slope compensation control unit 55. The input-end divider 101 is electrically connected to the phase frequency detector 102. The charge pump circuit 103 is electrically connected to the phase frequency detector 102. The loop filter 104 is electrically connected to the charge pump circuit 103. The voltage controlled oscillator 51 is electrically connected to the loop filter 104. The output-end divider 106 is electrically connected to the voltage-controlled oscillator 51. The feedback divider 107 is electrically connected to the voltage-controlled oscillator 51 and the phase frequency detector 102. The frequency/voltage slope calculation module is electrically connected to the loop filter 104 and the voltage-controlled oscillator 51.

The functions of the input-end divider 101, the phase frequency detector 102, the charge pump circuit 103, the loop filter 104, the output-end divider 106 and the feedback divider 107 are as same as the descriptions above, so they will not be repeated here. The frequency/voltage slope calculation module is configured to calculate a frequency/voltage slope of the voltage-controlled oscillator 51 based on the control voltage VCP and the clock signals V_CLK and I_CLK. The frequency/voltage slope calculation module is also configured to generate a slope compensation control signal based on the frequency/voltage slope of the voltage-controlled oscillator 51. The frequency/voltage slope of the voltage-controlled oscillator 51 is a ratio of the frequency of the clock signal V_CLK to the control voltage VCP.

The voltage-controlled oscillator 51 includes a compensation device 511. The voltage-controlled oscillator 51 is configured to generate the linear current based on the control voltage VCP. The compensation device 511 is configured to generate the control current based on the slope compensation control signal. As well, the voltage-controlled oscillator 51 is configured to generate the clock signal V_CLK based on the control current. Furthermore, the control current and the linear current are in a multiple relationship, and a multiple of the multiple relationship is determined by the slope compensation control signal. When the frequency/voltage slope is within a range, the slope compensation control signal maintains the multiple. When the frequency/ voltage slope is greater than an maximum slope value of the range, the slope compensation control signal decreases the multiple. When the frequency/voltage slope value is less than a minimum slope value of the range, the slope compensation control signal increases the multiple. Simply speaking, if a certain offset factor causes the frequency of the clock signal V_CLK to be decreased, the frequency/voltage slope of the voltage-controlled oscillator 51 is increased for compensation. Similarly, if a certain offset factor causes the frequency of the clock signal V_CLK to be increased, the frequency/voltage slope of the voltage-controlled oscillator 51 is decreased for compensation.

The frequency/voltage slope calculation module includes the analog-to-digital converter (ADC) 52, the frequency acquisition device 53, the slope calculation unit 54 and the slope compensation control unit 55. The analog-to-digital converter 52 is electrically connected to the loop filter 104. The frequency acquisition device 53 is electrically connected to the voltage-controlled oscillator 51. The slope calculation unit 54 is electrically connected to the analog-to-digital converter 52 and the frequency acquisition device 53. The slope compensation control unit 55 is electrically connected to the slope calculation unit 54 and the voltage-controlled oscillator 51.

The analog-to-digital converter 52 is configured to perform an analog-to-digital conversion on the analog control voltage VCP to generate a digital control voltage code. The more the number of bits of the analog-to-digital converter 52 is, the better the compensation effect will be in principle. The frequency acquisition device 53 is configured to obtain the frequency of the clock signal V_CLK based on the clock signals I_CLK and V_CLK. Moreover, the frequency of the clock signal I_CLK is known, but the frequency of the clock signal V_CLK is unknown. Thus, by obtaining and processing the clock signal V_CLK and the clock signal I_CLK, the frequency of the clock signal V_CLK can be known. The slope calculation unit 54 is configured to calculate the frequency/voltage slope based on the control voltage code and the frequency of the clock signal V_CLK. The slope compensation control unit 55 is configured to generate the slope compensation control signal based on the frequency/voltage slope.

Figure 6:
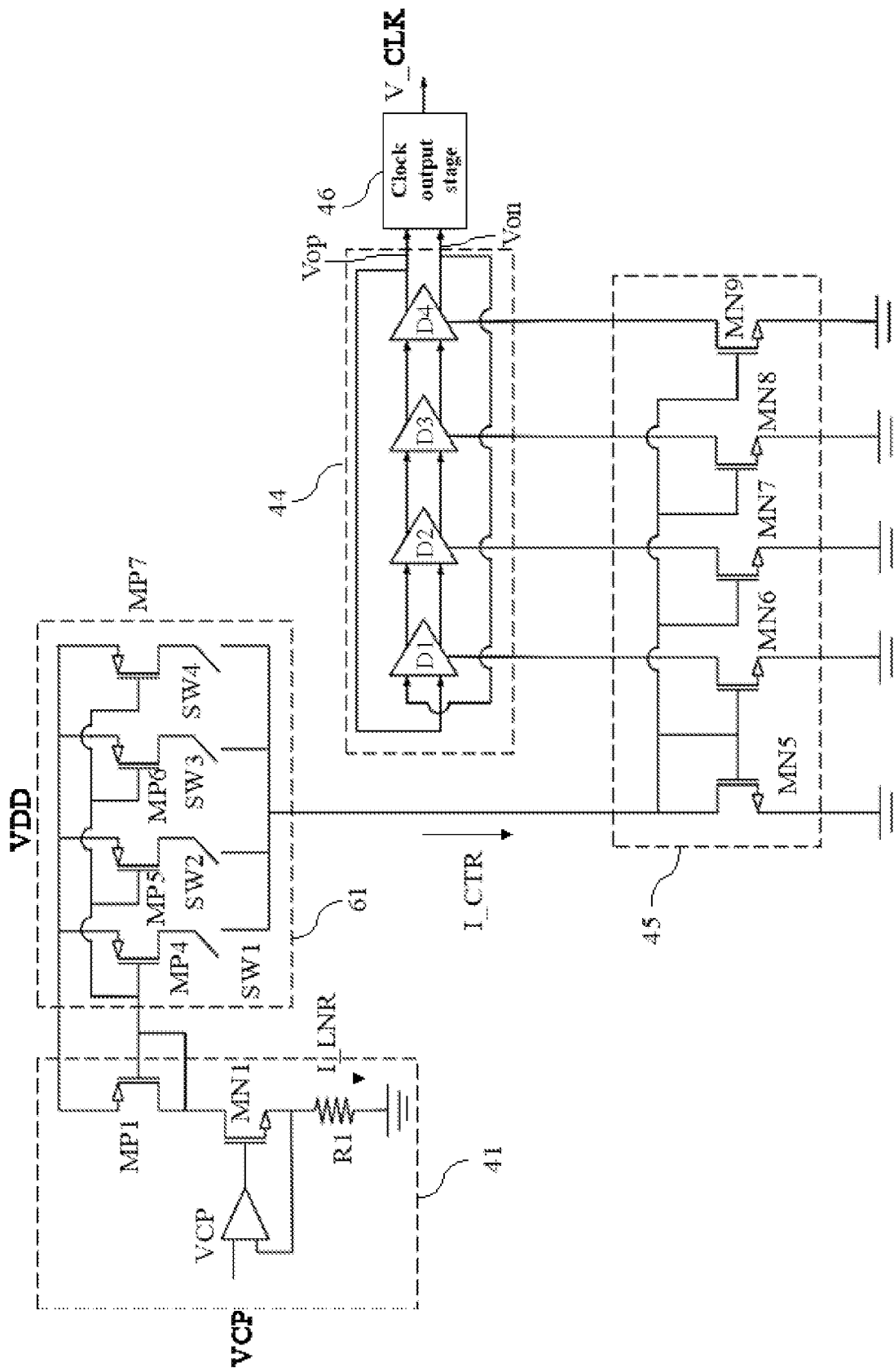
FIG. 6 is a circuit diagram of a voltage-controlled oscillator according to another embodiment of the present disclosure.

Next, refer to FIG. 6, FIG. 6 is a circuit diagram of a voltage-controlled oscillator according to another embodiment of the present disclosure. In this embodiment, the voltage-controlled oscillator 51 in FIG. 5 can be implemented by a voltage-controlled oscillator 6 in FIG. 6, and the process compensation device 511 in FIG. 5 can be implemented by a compensation device 61 in FIG. 6, but the present disclosure is not limited thereby. Further, the voltage-controlled oscillator 6 includes the voltage-to-current device 41, the compensation device 61 and the clock signal generating module. Besides, the clock signal generating module includes the delay oscillation module 44, the current module 45 and the clock output stage 46. The compensation device 61 is electrically connected to the voltage-to-current device 41 and the clock signal generating module. The functions of the voltage-to-current device 41 and the clock signal generating module are as described above, so they are not repeated here.

The compensation device 61 is configured to generate the control current based on the slope compensation control signal. The compensation device 61 includes a plurality of switchable current sources. It should be noted that PMOS transistors MP4 to MP7 and switches SW1 to SW4 respectively form four switchable current sources. However, the present disclosure is not limited by the number of the switchable current sources, as long as there are multiple, preferably, at least three switchable current sources. Each of the switchable current sources is electrically connected to the voltage-to-current device 41. Moreover, each of the switchable current sources is configured to generate a duplicated current based on the linear current. Also, each of the switchable current sources is controlled by the slope compensation control signal to determine whether the duplicated current as a part of the control current I_CTR is outputted. Further, gates of the PMOS transistors MP4 to MP7 are electrically connected to the gate of the PMOS transistor MP1. Sources of the PMOS transistors MP4 to MP7 are electrically connected to the supply voltage VDD. First ends of the switches SW1 to SW4 are respectively electrically connected to drains of the PMOS transistors MP4 to MP7. Second ends of the switches SW1 to SW4 are electrically connected to the drain of the NMOS transistor MN5. The switches SW1 to SW4 are controlled by the slope compensation control signal to determine which switches are turned on or off.

For example, during the fast PMOS-fast NMOS offset, only the switch SW1 is turned on, and the other switches SW2 to SW3 are turned off. During the typical PMOS-typical NMOS offset, the switches SW2 and SW3 is turned on, and the other switches SW1 and SW4 are turned off. During the slow PMOS-slow NMOS offset, all switches SW1 to SW4 are turned off.

Please note that the plurality of switchable current sources preferably have different magnitudes of duplicated currents, but the present disclosure is not limited thereto. For example, the duplicated current of the switchable current source formed by the PMOS transistor MP4 and the switch SW1 is $2^0$ times the linear current. The duplicated current of the switchable current source formed by the PMOS transistor MP5 and the switch SW2 is $2^1$ times the linear current. The duplicated current of the switchable current source formed by the PMOS transistor MP6 and the switch SW3 is $2^2$ times the linear current. As well, the duplicated current of the switchable current source formed by the PMOS transistor MP7 and the switch SW3 is $2^3$ times the linear current.

Figure 7:
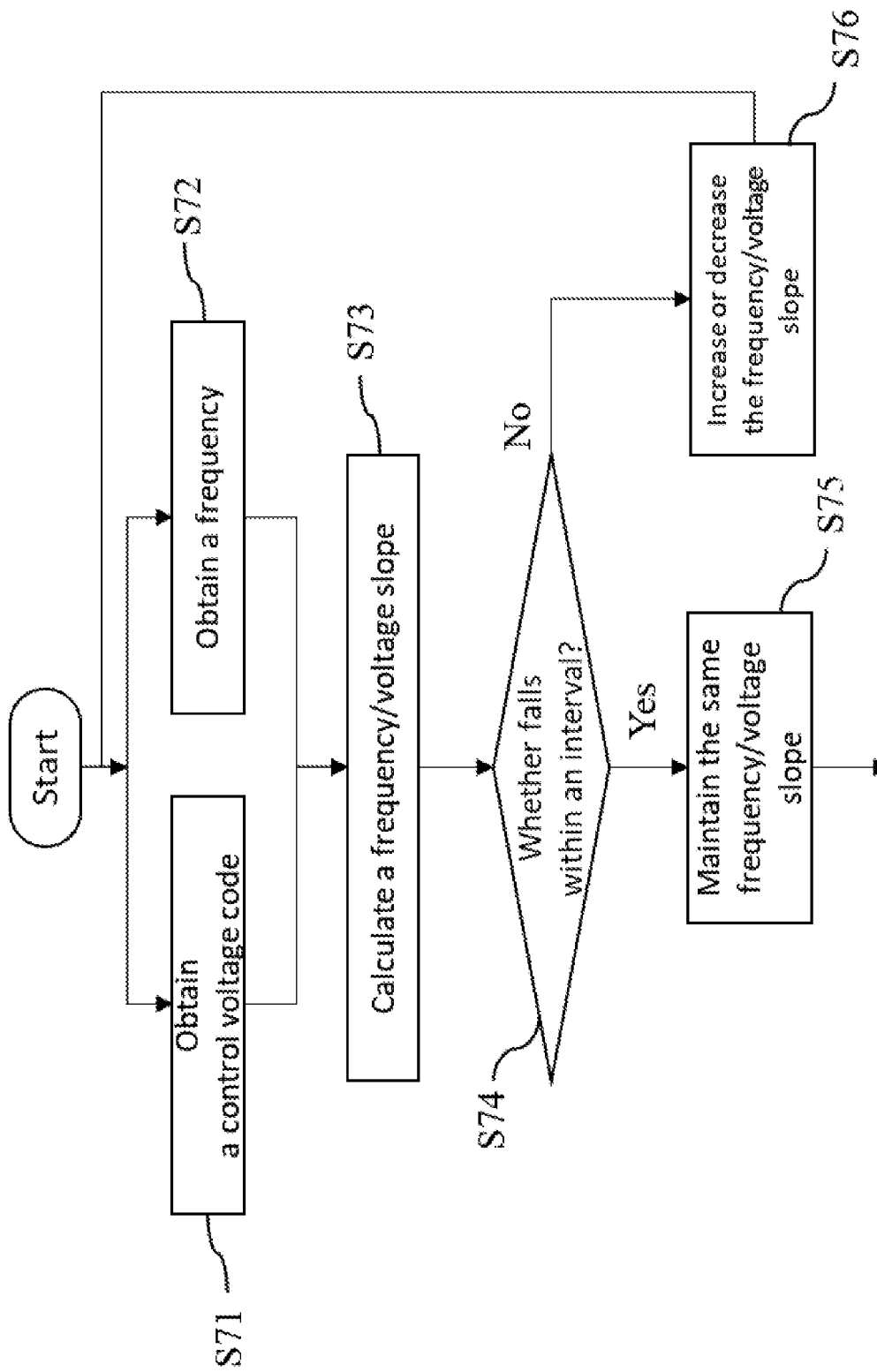
FIG. 7 is a flowchart of a compensation method for a phase-lock loop circuit according to an embodiment of the present disclosure.

Please refer to FIG. 7, which is a flowchart of a compensation method for a phase-lock loop circuit according to an embodiment of the present disclosure. In step S71, an analog-to-digital conversion is performed on an analog control voltage output by a loop filter in a phase-lock loop circuit to generate a control voltage code. In step S72, a frequency of a clock signal generated by a voltage-controlled oscillator is obtained based on a clock signal input to the phase-lock loop circuit and the clock signal generated by the voltage-controlled oscillator in the phase-lock loop circuit. In addition, the execution sequence of step S71 and step S72 may be simultaneous, or they are in sequence, as long as step S71 and step S72 are before step S73. Then, in step S73, the frequency/voltage slope of the voltage-controlled oscillator is calculated based on the control voltage code and the frequency of the clock signal generated by the voltage-controlled oscillator.

Next, in step S74, it is determined that whether the frequency/voltage slope falls within the range formed by an maximum slope value and a minimum slope value. If the frequency/voltage slope falls within the range, entering step S75, the frequency/voltage slope keeps the same. If the frequency/voltage slope exceeds the range, and the frequency/voltage slope is greater than the maximum slope value, entering step S76, the frequency/voltage slope is decreased. If the frequency/voltage slope exceeds the range, and the frequency/voltage slope is smaller than the minimum slope value, entering step S75, the frequency/voltage slope is increased.

As stated as above, the present disclosure provides a variety of dynamic offset compensation schemes for phase-lock loop circuits. Therefore, through the technical solution of the present disclosure, there is no need to over-design the phase-lock loop circuits. Moreover, the technical solution of the present disclosure can effectively reduce the circuit area and energy consumption, and fully meet the current design trends of light, short, energy-saving and carbon-saving electronic products. Thus, the present disclosure has great economic value.

It should be understood that the examples and the embodiments described herein are for illustrative purpose only, and various modifications or changes in view of them will be suggested to those skilled in the art, and will be included in the spirit and scope of the application and the appendix with the scope of the claims.

What is claimed is:

1. A voltage-controlled oscillator for a phase-lock loop circuit, utilized to receive a control voltage and generate a clock signal, wherein the voltage-controlled oscillator comprises:
   a voltage-to-current device, configured to generate a linear current based on the control voltage;
   a process compensation device, configured to generate a compensation current based on the control voltage, wherein the compensation current is proportional to a transistor operation speed corresponding to a process offset;
   a subtraction unit, electrically connected to the voltage-to-current device and the process compensation device, and configured to subtract the compensation current from the linear current to generate a control current; and
   a clock signal generating module, electrically connected to the subtraction unit, and configured to generate the clock signal based on the control current,
   wherein the process compensation device comprises a first PMOS transistor, a second PMOS transistor, a first NMOS transistor, a second NMOS transistor and a resistor, and
   wherein a source of the first PMOS transistor and a source of the second PMOS transistor are electrically connected to a supply voltage, a gate of the first PMOS transistor and a gate of the second PMOS transistor are electrically connected to each other, a drain of the first PMOS transistor is electrically connected to a drain of the first NMOS transistor, a drain of the second PMOS transistor is electrically connected to a drain of the second NMOS transistor, a gate of the first NMOS transistor is configured to receive the control voltage, a source of the first NMOS transistor is electrically connected one end of the resistor, the other end of the resistor is electrically connected to a low voltage, a gate of the second NMOS transistor is electrically connected to the subtraction unit and the drain of the second NMOS transistor, and a source of the second NMOS transistor is electrically connected to the low voltage.

2. The voltage-controlled oscillator according to claim 1, wherein the clock signal generating module comprises:
   a current module, comprising a plurality of current units electrically connected to the subtraction unit, wherein the plurality of current units are configured to generate a plurality of delay control currents based on the control current;
   a delay oscillation module, comprising a plurality of delay units electrically connected to the plurality of current units,
   wherein except for the last one of the plurality of delay units, a first output end of each of one of the plurality of delay units is electrically connected to a first input end of a next one of plurality of delay units, and a second output end of the one of the plurality of delay units is electrically connected to a second input end of the next one of the plurality of delay units,
   wherein a first output end of the last one of the plurality of delay units is electrically connected to a second input end of a first one of the plurality of delay units, and a second output end of the last one of the plurality of delay units is electrically connected to a first input end of the first one of the plurality of delay units,
   wherein a delay time of each of the plurality of delay units is controlled by a corresponding one of the plurality of delay control currents, and
   a clock output stage, electrically connected to the delay oscillation module, and configured to generate the clock signal based on the first sine wave signal and the second sine wave signal.

3. A phase-lock loop circuit, comprising:
   an input-end divider, configured to divide a frequency of a first clock signal to generate a second clock signal;
   a phase frequency detector, electrically connected to the input-end divider, and configured to generate a first pulse wave signal and a second pulse wave signal based on a phase frequency difference between the second clock signal and a feedback clock signal;
   a charge pump circuit, electrically connected to the phase frequency detector, and configured to generate a charge-discharge current signal based on the first pulse wave signal and the second pulse wave signal;
   a loop filter, electrically connected to the charge pump circuit, and configured to generate a control voltage based on the charge-discharge current signal;
   a voltage-controlled oscillator, electrically connected to the loop filter, and configured to generate a linear current based on the control voltage, generate a compensation current based on a process offset, generate a control current by subtracting the compensation current form the linear current, and generate a third clock signal based on the control current, wherein the compensation current is proportional to a transistor operation speed corresponding to the process offset;
   an output-end divider, electrically connected to the voltage-controlled oscillator, and configured to divide a frequency of the third clock signal to generate an output clock signal; and
   a feedback divider, electrically connected to the voltage-controlled oscillator and the phase frequency detector, and configured to divide the frequency of the third clock signal to generate a feedback clock signal,
   wherein the voltage-controlled oscillator comprises:
      a voltage-to-current device, configured to generate the linear current based on the control voltage;
      a process compensation device, configured to generate the compensation current based on the control voltage;
      a subtraction unit, electrically connected to the voltage-to-current device and the process compensation device, and configured to subtract the compensation current from the linear current to generate the control current; and a clock signal generating module, electrically connected to the subtraction unit, and configured to generate the third clock signal based on the control current, wherein the process compensation device comprises a first PMOS transistor, a second PMOS transistor, a first NMOS transistor, a second NMOS transistor and a resistor, and wherein a source of the first PMOS transistor and a source of the second PMOS transistor are electrically connected to a supply voltage, a gate of the first PMOS transistor and a gate of the second PMOS transistor are electrically connected to each other, a drain of the first PMOS transistor is electrically connected to a drain of the first NMOS transistor, a drain of the second PMOS transistor is electrically connected to a drain of the second NMOS transistor, a gate of the first NMOS transistor is configured to receive the control voltage, a source of the first NMOS transistor is electrically connected one end of the resistor, the other end of the resistor is electrically connected to a low voltage, a gate of the second NMOS transistor is electrically connected to the subtraction unit and the drain of the second NMOS transistor, and a source of the second NMOS transistor is electrically connected to the low voltage.

\* \* \* \* \*